United States Patent [19]

Toyoda

[11] 4,309,762
[45] Jan. 5, 1982

[54] SEMICONDUCTOR MEMORY APPARATUS

[75] Inventor: Kazuhiro Toyoda, Yokohama, Japan

[73] Assignee: Fujitsu Limited, Japan

[21] Appl. No.: 87,390

[22] Filed: Oct. 22, 1979

[30] Foreign Application Priority Data

Oct. 30, 1978 [JP] Japan ................... 53-133386

[51] Int. Cl.³ .................................. G11C 11/40
[52] U.S. Cl. .................... 365/179; 365/104; 365/51
[58] Field of Search ................ 340/173 PC; 365/45, 365/103, 104, 182, 184, 179

[56] References Cited

U.S. PATENT DOCUMENTS 3,781,828 12/1973 Platt et al. .................. 365/179

Primary Examiner—Terrell W. Fears
Attorney, Agent, or Firm—Staas & Halsey

[57] ABSTRACT

A semiconductor memory apparatus is formed of a plurality of memory cells, each of which is connected to a first word line and a second word line. According to the present invention, emitters of the transistors by which the hold current of the memory cells are determined have different areas, so that the hold currents which are supplied to each of said memory cells are uniformly distributed.

8 Claims, 14 Drawing Figures

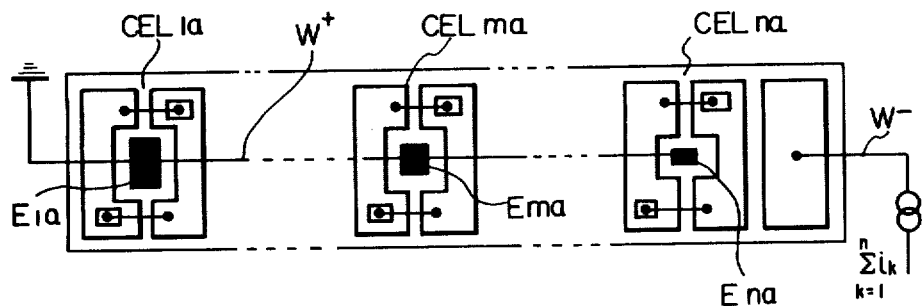
Fig. 7A
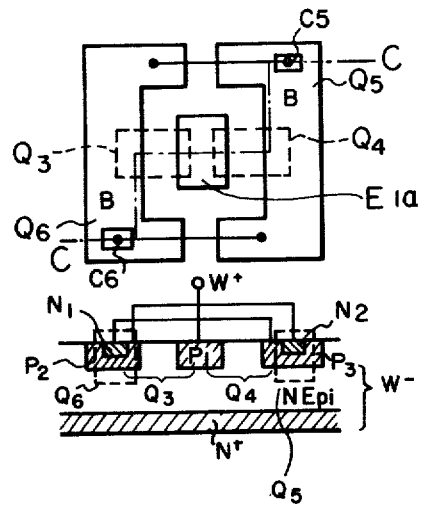
Fig. 7B
Fig. 7C
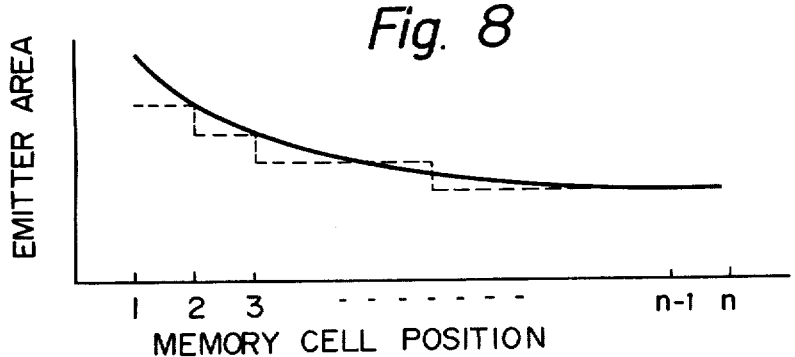
Fig. 8

SEMICONDUCTOR MEMORY APPARATUS

FIELD OF THE INVENTION

The present invention relates to an improvement of a semiconductor memory apparatus formed by a plurality of memory cells each of which is connected to a first word line and a second word line.

BACKGROUND OF THE INVENTION

In a semiconductor memory apparatus, a plurality of memory cells are arranged in a memory cell array, and each memory cell is connected to a first word line and a second word line, so that the hold currents are supplied from the word lines to the memory cells. In the memory cell array mentioned above, the word lines have an electrical resistance. Thus, the hold currents which are supplied to the memory cells are not uniformly distributed because the potential drop caused in the word lines decreases the noise immunity of the semiconductor memory apparatus. When the word lines are formed of a material having a high electrical resistance, such as poly silicon, the above-mentioned inconvenience appears. Furthermore, even if the word lines are formed of a metal, such as aluminium, when the memory apparatus is formed as a fine construction by a high integration technique, the above-mentioned drawback is magnified due to a parasitic resistance in the word lines.

The decrease in the noise immunity due to the non-uniform distribution of the hold current can be overcome by increasing the minimum hold current, thus improving the noise immunity in the memory cell having the minimum hold current. However, when the minimum hold current increases, the hold current in the other cells also increases, and therefore, the electric power dissipation in the whole memory apparatus increases.

OBJECTS AND SUMMARY OF THE INVENTION

An object of the present invention is to equalize the hold currents of the memory cells which are arranged in a memory array.

Another object of the present invention is to prevent the noise immunity of the memory apparatus from decreasing due to the parasitic resistance of the word lines.

The above-mentioned objects are achieved by a semiconductor memory apparatus having a plurality of memory cells which are connected to word lines. The memory cells have transistor emitter areas which determine the hold current of the memory cells. The emitters areas are varied, so that the hold currents which are supplied to each of the memory cells are uniformly distributed.

Further features and advantages of the present invention will be apparent from the ensuing description with reference to the accompanying drawings to which, however, the scope of the invention is in no way limited.

BRIEF DESCRIPTION OF THE DRAWINGS

FIGS. 7A, 7B and 7C illustrate another embodiment of the semiconductor apparatus according to the present invention;

FIG. 8 is a graph showing the relationship of the emitter area and the memory cell position in the semiconductor memory apparatus shown in FIG. 7A;

DETAILED DESCRIPTION OF THE PREFERRED EMBODIMENTS

Figure 1:
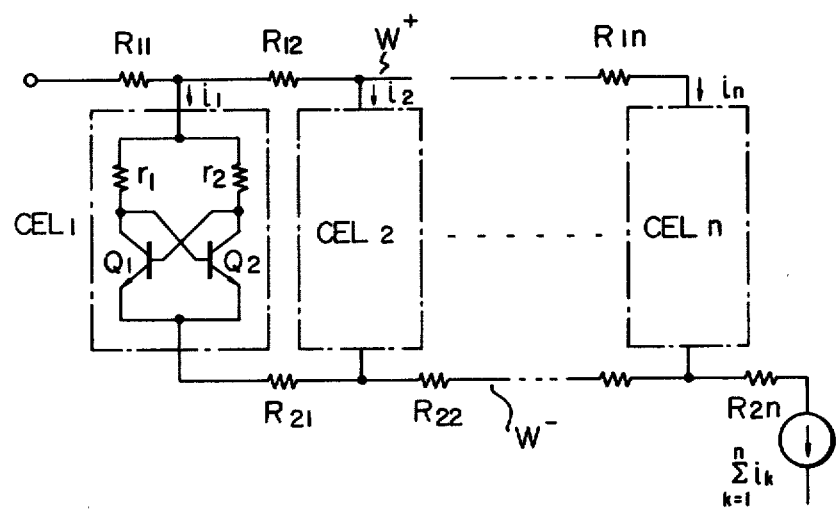
FIG. 1 illustrates one example of the circuit of a conventional semiconductor memory apparatus.

Referring to FIG. 1, a semiconductor memory apparatus is formed by cells $CEL_1$ through $CEL_n$ and each cell is connected to a word line $W^+$ and a word line $W^-$ and hold currents $i_1, i_2, \ldots, i_n$ are supplied to the cells $CEL_1$ through $CEL_n$. Each memory cell is formed by: a first resistor, $r_1$, and second resistor, $r_2$, one end of each of which are connected to a first word line $W^+$; a first transistor, $Q_1$, and a second transistor, $Q_2$, each having a collector which is connected to the other end of the first resistor, $r_1$, and second resistor, $r_2$, respectively; the first transistor, $Q_1$, and the second transistor, $Q_2$, each having an emitter which is commonly connected to a second word line $W^-$; the first transistor $Q_1$ having a base which is connected to the collector of the second transistor $Q_2$, and the second transistor $Q_2$ having a base which is connected to the collector of the first transistor $Q_1$.

Figure 2:
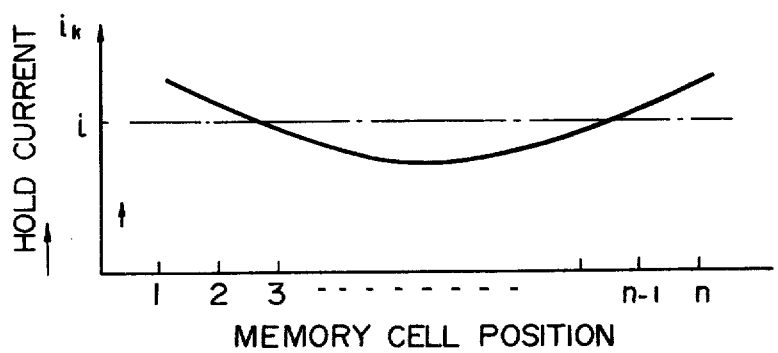
FIG. 2 is a graph showing the distribution of hold currents in the circuit shown in FIG. 1.

In the semiconductor memory apparatus shown in FIG. 1, the values of the hold currents $i_1, i_2, \ldots, i_n$ are distributed as shown in FIG. 2, due to the voltage drops caused in the resistances $R_{11}$ through $R_{1n}$ and $R_{21}$ through $R_{2n}$. As shown in FIG. 2, the values of the hold currents differ in accordance with the memory cell position, and the hold currents which are supplied to the memory cells positioned at the middle part of the array are smaller than a mean hold current value of $$i = \frac{1}{n} \sum_{k=1}^{n} i_k;$$

therefore, the noise immunity is considerably decreased and a malfunction is likely to occur.

Figure 3:
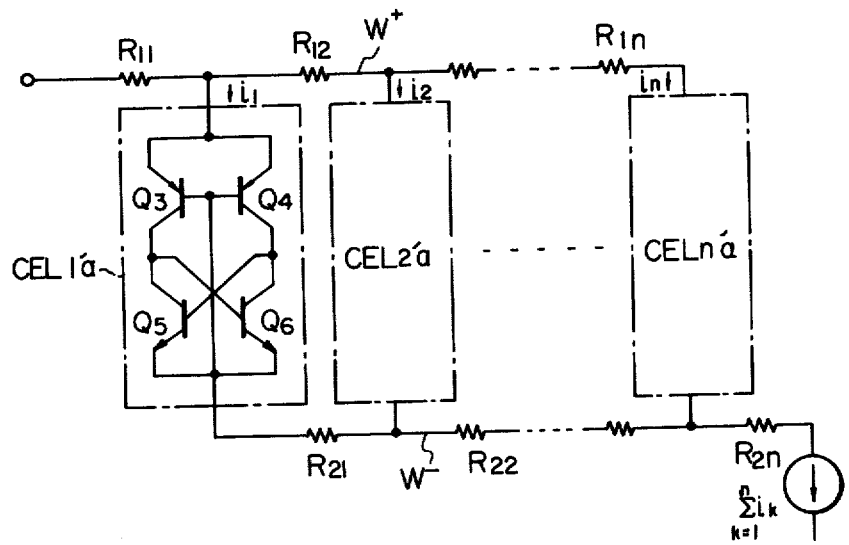
FIG. 3 illustrates another example of the circuit of a conventional semiconductor memory apparatus.
Figure 4:
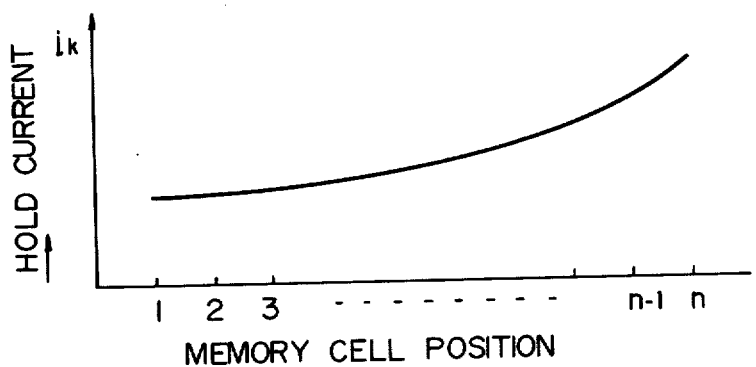
FIG. 4 is a graph showing the distribution of the hold currents in the circuit shown in FIG. 3.

The semiconductor memory apparatus illustrated in FIG. 3 is formed by cells $CEL_{1a}, CEL_{2a}, \ldots CEL_{na}$ and each cell is connected to the word lines $W^+$ and $W^-$, and the hold currents $i_1$ through $i_n$ are supplied to each cell. Each memory cell is formed by integrated injection logic and includes: a pair of first and second transistors $Q_3$, $Q_4$ of a first conductivity type which have a common emitter forming an injector connected to a first word line W+; a pair of third and fourth transistors Q$_5$, Q$_6$ of a second conductivity type each of which has a collector connected to a collector of the first and second transistors Q$_3$, Q$_4$, respectively; the third transistor Q$_5$ having a base which is connected to the collector of the fourth transistor Q$_6$, the fourth transistor Q$_6$ having a base which is connected to the collector of the third transistor Q$_5$, and the first and second transistors Q$_3$, Q$_4$ having bases which are connected to the emitters of the third and fourth transistors Q$_5$, Q$_6$ and to a second word line W$^-$. In the device shown in FIG. 3, the hold currents $i_1, i_2, \ldots, i_n$ are supplied from the word line W+ having parasitic resistances R$_{11}$ through R$_{1n}$, and R$_{21}$ through R$_{2n}$ to the memory cells CEL$_{1a}$ through CEL$_{na}$. In the apparatus formed by the integrated injection type memory cells, the word line W$^-$ is formed by a buried diffusion layer. Therefore, the parasitic resistances R$_{21}$ through R$_{2n}$ are larger than the parasitic resistances R$_{11}$ through R$_{1n}$. Accordingly, the value of the hold currents $i_1, i_2, \ldots, i_n$ are distributed as shown in FIG. 4 in accordance with the memory cell position, and the hold currents supplied to the memory cells positioned at the right side are larger than the hold currents supplied to the memory cells positioned at the left side.

In the present invention, the hold currents of the memory cells can be equalized by changing the area of the emitter of the transistor. This is because the hold current of the memory cell is determined by the emitter area.

Figure 5:
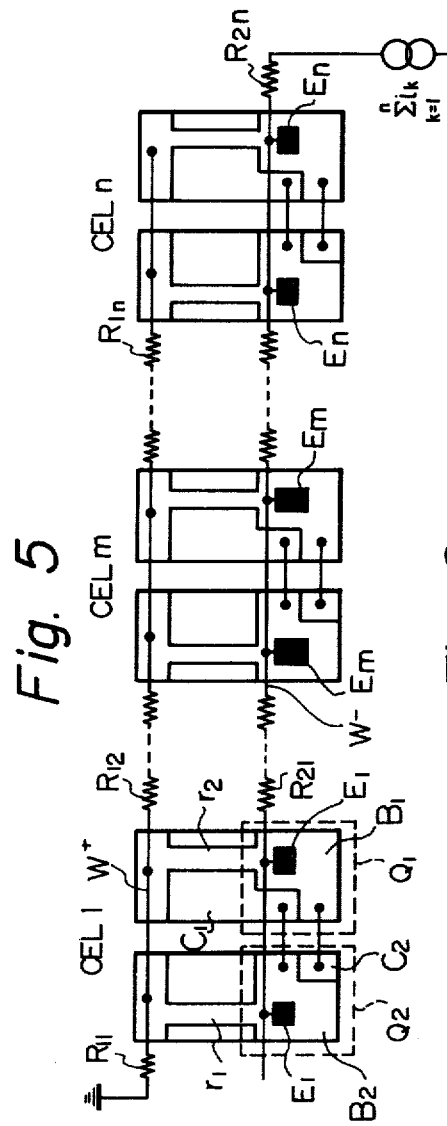
FIG. 5 illustrates a plan view of the patterns of one embodiment of the semiconductor memory apparatus according to the present invention.
Figure 6:
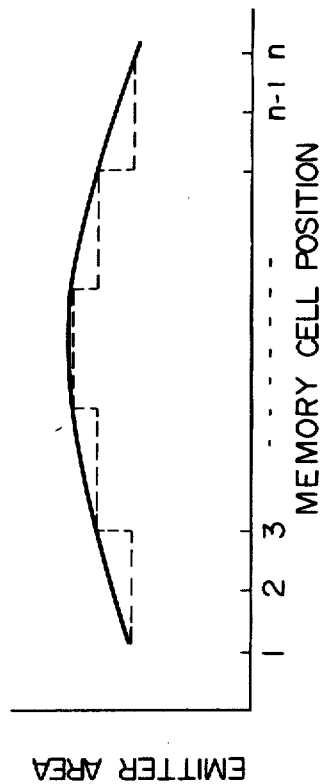
FIG. 6 is a graph showing the relationship between the emitter area and the memory cell position in the semiconductor memory apparatus shown in FIG. 5.

FIG. 5 is a plan view of patterns of a first embodiment of the integrated memory apparatus according to the present invention. This apparatus shown in FIG. 5 corresponds to the circuit shown in FIG. 1, and symbols which are the same in both figures illustrate the same elements. The symbols B$_1$, B$_2$ and C$_1$, C$_2$ denote the bases and collectors of transistors in the memory cell CEL$_1$. As shown in FIG. 5, the characteristic feature of the present invention is that the area of the emitter E$_m$ of the transistor included in the cell which is positioned in the middle portion of the array is larger than the areas of the emitters of the transistors included in the cell which are positioned at the end portion of the array. The relationship between the emitter area and the memory cell position is illustrated in FIG. 6. Referring to FIG. 6, the emitter area in the cell positioned in the middle portion is larger than those areas of the emitters of the transistor included in the cell at the end portion of the array. Furthermore, the emitter area can be changed continuously from position 1 to the position n as shown by the solid line in FIG. 6. The emitter area can also be changed in each group from the position 1 to the position n as shown by the dotted line in FIG. 6.

FIGS. 7A, 7B and 7C show a second embodiment of the integrated memory apparatus according to the present invention. The apparatus shown in FIG. 7A corresponds to the circuit shown in FIG. 3, and the same symbols as those used in FIG. 3 illustrate the same portions as those in FIG. 3. Referring to FIGS. 7A, 7B and 7C, FIG. 7A illustrates a plan view of a pattern of the apparatus and corresponds to FIG. 3, FIG. 7B illustrates a plan view of the details of construction of CEL$_{1a}$, and FIG. 7C illustrates the cross section along C—C of the CEL$_{1a}$ shown in FIG. 7B. In FIG. 7C, an epitaxial layer NE$_{pi}$ is formed on the semiconductor substrate via a buried layer N+, p type impurity regions P$_1$, P$_2$, P$_3$ are formed in the epitaxial layer NP$_{pi}$, n type impurity regions N$_1$ and N$_2$ are formed in the p type impurity regions P$_1$ and P$_3$. The transistor Q$_3$ is formed by regions P$_1$, NE$_{pi}$ and P$_2$; the transistor Q$_4$ is formed by regions P$_1$, NE$_{pi}$ and P$_3$; the transistor Q$_6$ is formed by regions by regions N$_1$, P$_2$ and NE$_{pi}$; and the transistor Q$_5$ is formed by regions N$_2$, P$_3$ and NE$_{pi}$. Furthermore, the region P$_1$ is connected to the word line W+ and the region NE$_{pi}$ including the buried layer N+ forms the word line W$^-$.

When the hold currents supplied to the cells CEL$_{1a}$ through CEL$_{na}$ are uniformly distributed, the areas of the emitter of the transistors used as injectors are changed, as illustrated in FIG. 8. In the apparatus shown in FIG. 7A, the emitter area can be changed continuously from the position 1 to the position n as shown by the solid line in FIG. 8, and also the emitter can be changed in each group including a plurality of the memory cells from the position 1 to the position n as shown in dotted line in FIG. 8.

Figure 9:
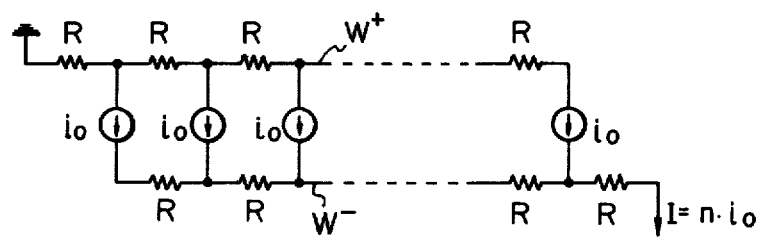
FIG. 9 is an equivalent circuit of the semiconductor memory apparatus which is used for determining the areas of the emitter according to the present invention.

Next, we will explain the condition for uniformly distributing the constant hold currents to the memory cells. In FIG. 9, we assume that parasitic resistance in the word line is R and the constant hold current supplied to the memory cells is $i_0$. The voltage drop caused in the upper word line W+ is illustrated by a curve A shown in FIG. 10. In the curve A in FIG. 10, the voltage deviation $\Delta V_m$ with respect to the straight line a in the memory cell m is expressed as shown below:

$$\Delta V_m = \frac{R \cdot i_0}{2}(n-m)(m-1) \tag{1}$$

The voltage drop caused in the lower word line W$^-$ is similarly illustrated by a curve B shown in FIG. 10, and the voltage deviation $\Delta V'_m$ with respect to the straight line b in the memory cell is expressed as shown below:

$$\Delta V'_m = \frac{R \cdot i_0}{2}(n-m)(m-1) \tag{2}$$

Therefore, the value of the voltage E$_m$ applied to the memory cell CEL$_m$ is smaller than the voltage E$_1$ and E$_n$ applied to the memory cells CEL$_1$ and CEL$_n$. The difference between the voltage E$_m$ and E$_1$, E$_n$ is shown below:

$$\Delta V_m + \Delta V'_m = R \cdot i_0 (n-m)(m-1) \tag{3}$$

Figure 11A:
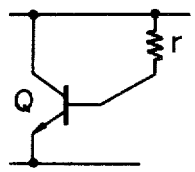
FIGS. 11A and 11B are equivalent circuits, of the memory cell, which are used for determining the hold current in the present invention.
Figure 11B:
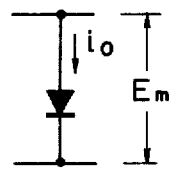

The construction of the memory cell portion which has a relationship to the hold current of the memory cell can be illustrated by a transistor Q and a resistor r shown in FIG. 11A and the voltage current characteristic of the memory cell can be illustrated by a diode as shown in FIG. 11B. Therefore, with respect to the memory cell CEL$_m$, the current $i_0$ is supplied by applying the voltage E$_m$. The voltage E$_m$ is expressed as shown below:

$$E_m = \frac{k \cdot T}{q} \log \frac{i_0}{A_m J_s} \tag{4}$$

In the equation (4) above, q is an electric charge of the electron, k is Boltzman's constant, T is an absolute temperature, A$_m$ is the emitter area, and J$_s$ is a saturation current per unit area of the emitter junction. The voltage E$_m$ is also expressed as $$E_m = E_1 - R \cdot i_0(n-m)(m-1) \qquad (5)$$

The emitter area of the memory cell in each position can be determined by the voltage $E_1$ which is applied to the memory cell positioned at both terminals of the memory cell array and the number of the cell position m.

Figure 10:
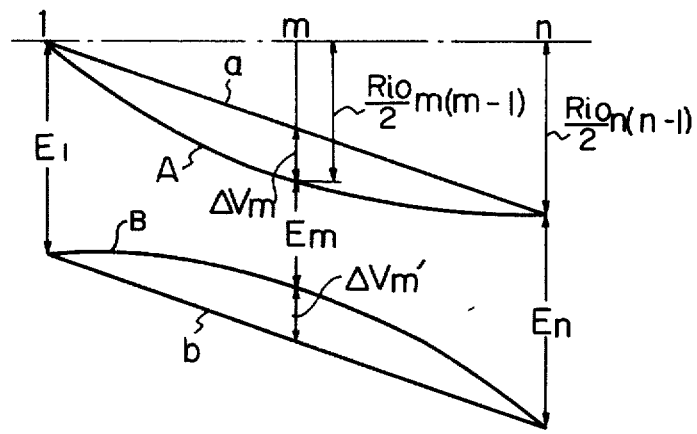
FIG. 10 is a diagram showing the voltage distribution in the equivalent circuit shown in FIG. 9.

With respect to the hold currents supplied to the memory cell array having the characteristics shown in FIG. 4, a similar calculation as carried out with respect to FIGS. 9 and 10 can be applied, and emitter areas which are changed from the position 1 to the position n can be obtained.

As mentioned above, according to the present invention, the emitter areas of the transistors ($Q_1$, $Q_2$ in FIG. 1 and $Q_3$, $Q_4$ in FIG. 3) by which the hold current of the memory cell are determined are changed so that the deviation of the applied voltage to the memory cell due to the parasitic resistance in the word line is compensated. The emitter areas can be changed in each memory cell or in each memory cell group, so that the hold currents can be uniformly supplied to the memory cells, the noise immunity in each memory cell can be equalized and the effect of the parasitic resistance in the word line can be removed. Therefore, the operation of each memory cell having a high density can be stabilized. As the emitter areas can be obtained by taking into consideration the material and the dimension of the word line, the manufacturing process can be easily carried out and a semiconductor memory apparatus having a predetermined noise immunity can be easily obtained.

What is claimed is:

1. A semiconductor memory apparatus, having memory cells which are connected to first and second word lines, comprising:
    first and second transistors, included in each of the memory cells, for supplying a hold current, each of said first and second transistors having an emitter region which determines said hold current, and said first and second transistors of each of the memory cells having emitter regions which have an area different from the area of the emitter regions of the first and second transistors of the other memory cells so that the hold currents of the memory cells are uniformly distributed.

2. A semiconductor memory apparatus according to claim 1, wherein in each of the memory cells said first transistor has an emitter area which is different from the emitter area of said second transistor.

3. A semiconductor memory apparatus, having groups of memory cells which are connected to first and second word lines, comprising:
    first and second transistors, included in each of the memory cells, for supplying a hold current,
    wherein an emitter region in each of said first and second transistors determine said hold current, and wherein said first and second transistors of a first group of the memory cells have emitter regions which have a different area from the emitter regions of the first and second transistors of a second group of the memory cells so that the hold currents of the memory cells are uniformly distributed.

4. A semiconductor memory apparatus, having first and second word lines comprising:
    a first memory cell operatively connected to said first and second word lines, comprising:
        a first transistor pair, operatively connected to said first and second word lines, for supplying a first hold current, wherein each of the transistors of said first transistor pair has an emitter region, and wherein the emitter regions of the transistors of said first transistor pair determine said first hold current;
    a second memory cell, operatively connected to said first and second word lines, comprising:
        a second of pair of transistors, operatively connected to said first and second word lines, for supplying a second hold current, wherein each of the transistors of said second transistor pair has an emitter region, and wherein the emitter regions of the transistors of said second transistor pair determine said second hold current;
    wherein the transistors of said first transistor pair have emitter regions which have a different area from the emitter regions of the transistors of said second transistor pair, whereby the hold currents of said first and second memory cells are uniformly distributed.

5. A semiconductor memory apparatus according to claim 4, wherein each of the transistors of said first transistor pair has a different emitter region area.

6. A semiconductor memory apparatus as set forth in claim 5, wherein each of the transistors of said second transistor pair has a different emitter region area.

7. A semiconductor memory apparatus, having memory cells which are connected to first and second word lines, comprising:
    first and second transistors, included in each of the memory cells, for supplying a hold current, each of said first and second transistors having an emitter region which determines said hold current, and said first and second transistors of each of the memory cells having emitter regions which have an area different from the area of the emitter regions of the first and second transistors of the other memory cells so that the hold currents of the memory cells are uniformly distributed, each of the memory cells further comprising:
    first and second resistors operatively connected to the first word line, said first and second transistors each having a collector operatively connected to said first and second resistors, respectively, said first and second transistors each having an emitter which is commonly connected to the second word line, said first transistor having a base which is connected to the collector of said second transistor, and said second transistor having a base which is connected to the collector of said first transistor.

8. A semiconductor memory apparatus, having memory cells which are connected to first and second word lines, comprising:
    first and second transistors, included in each of the memory cells, for supplying a hold current, each of said first and second transistors having an emitter region which determines said hold current, and said first and second transistors of each of the memory cells having emitter regions which have an area different from the area of the emitter regions of the first and second transistors of the other memory cells so that the hold currents of the memory cells are uniformly distributed, each of the memory cells being formed by integrated injection logic and comprising said first and second transistors, wherein said first and second transistors are of a first conductivity type and have a common emitter forming an injector connected to the first word line, and third and fourth transistors of a second conductivity type each of which has a collector connected to a collector of said first and second transistors, said third transistor having a base which is connected to said collector of said fourth transistor, said fourth transistor having a base which is connected to said collector of said third transistor, and said first and second transistors having bases which are connected to the emitter of said third and fourth transistors and to the second word line.

* * * * *